(12) United States Patent
Standing

(10) Patent No.: US 7,476,964 B2
(45) Date of Patent: Jan. 13, 2009

(54) HIGH VOLTAGE SEMICONDUCTOR DEVICE HOUSING WITH INCREASED CLEARANCE BETWEEN HOUSING CAN AND DIE FOR IMPROVED FLUX FLUSHING

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 1047 days.

(21) Appl. No.: 10/170,854

(22) Filed: Jun. 12, 2002

(65) Prior Publication Data
US 2003/0001247 A1  Jan. 2, 2003

Related U.S. Application Data

(60) Provisional application No. 60/299,048, filed on Jun. 18, 2001.

(51) Int. Cl.
*H01L 23/02* (2006.01)

(52) U.S. Cl. .................. 257/688; 257/727; 257/730; 257/731

(58) Field of Classification Search .............. 257/688, 257/727, 730, 731
See application file for complete search history.

(56) References Cited

U.S. PATENT DOCUMENTS

| | | | |
|---|---|---|---|
| 3,871,014 A | | 3/1975 | King et al. |
| 3,972,062 A | * | 7/1976 | Hopp .................. 257/778 |
| 4,021,838 A | | 5/1977 | Warwick |
| 4,392,151 A | | 7/1983 | Iwatani |
| 4,454,454 A | * | 6/1984 | Valentine ............... 318/293 |
| 4,604,644 A | | 8/1986 | Beckham et al. |
| 4,646,129 A | * | 2/1987 | Yerman et al. ........... 257/704 |
| 5,217,922 A | | 6/1993 | Akasaki et al. |
| 5,311,402 A | | 5/1994 | Kobayashi et al. |
| 5,313,366 A | | 5/1994 | Gaudenzi et al. |
| 5,367,435 A | | 11/1994 | Andros et al. |
| 5,371,404 A | | 12/1994 | Juskey et al. |
| 5,381,039 A | | 1/1995 | Morrison |
| 5,394,490 A | | 2/1995 | Kato et al. |
| 5,397,921 A | | 3/1995 | Karnezos |
| 5,447,886 A | | 9/1995 | Rai |
| 5,448,114 A | | 9/1995 | Kondoh et al. |
| 5,454,160 A | | 10/1995 | Nickel |

(Continued)

FOREIGN PATENT DOCUMENTS

EP  0 978 871  2/2000

(Continued)

OTHER PUBLICATIONS

Supplementary European Search Report dated Jun. 18, 2008 in European Patent Application No. 02739907.0.

*Primary Examiner*—Leonardo Andújar
(74) *Attorney, Agent, or Firm*—Ostrolenk, Faber, Gerb & Soffen, LLP

(57) ABSTRACT

A semiconductor device is shown and described which includes a metal can that receives a semiconductor die in an interior thereof. The metal can has a recess formed on a top portion thereof. The recess provides rigidity to the top portion of the metal can which allows the wall of the can to be spaced farther apart from the die, thereby providing a much larger open channel which allows for the easier cleaning of flux residue after soldering.

10 Claims, 3 Drawing Sheets

U.S. PATENT DOCUMENTS

| | | | |
|---|---|---|---|
| 5,455,456 A * | 10/1995 | Newman | 257/704 |
| 5,477,087 A | 12/1995 | Kawakita et al. | |
| 5,510,758 A | 4/1996 | Fujita et al. | |
| 5,512,786 A | 4/1996 | Imamura et al. | |
| 5,532,512 A | 7/1996 | Fillion et al. | |
| 5,554,887 A | 9/1996 | Sawai et al. | |
| 5,578,869 A | 11/1996 | Hoffman et al. | |
| 5,583,377 A | 12/1996 | Higgins, III | |
| 5,637,922 A * | 6/1997 | Fillion et al. | 257/728 |
| 5,654,590 A | 8/1997 | Kuramochi | |
| 5,703,405 A | 12/1997 | Zeber | |
| 5,726,489 A | 3/1998 | Matsuda et al. | |
| 5,726,501 A | 3/1998 | Matsubara | |
| 5,726,502 A | 3/1998 | Beddingfield | |
| 5,729,440 A | 3/1998 | Jimarez et al. | |
| 5,734,201 A | 3/1998 | Djennas et al. | |
| 5,739,585 A | 4/1998 | Akram et al. | |
| 5,814,894 A | 9/1998 | Igarashi et al. | |
| 5,841,183 A * | 11/1998 | Ariyoshi | 257/536 |
| 5,886,408 A | 3/1999 | Ohki et al. | |
| 6,051,888 A * | 4/2000 | Dahl | 257/778 |
| 6,133,634 A | 10/2000 | Joshi | |
| 6,391,687 B1 | 5/2002 | Cabahug et al. | |
| 6,624,522 B2 * | 9/2003 | Standing et al. | 257/782 |

FOREIGN PATENT DOCUMENTS

| | | |
|---|---|---|
| JP | 5-129516 | 5/1993 |
| JP | 07-263618 | 10/1995 |

* cited by examiner

HIGH VOLTAGE SEMICONDUCTOR DEVICE HOUSING WITH INCREASED CLEARANCE BETWEEN HOUSING CAN AND DIE FOR IMPROVED FLUX FLUSHING

RELATED APPLICATIONS

This application is based on and claims benefit of U.S. Provisional Application No. 60/299,048, filed on Jun. 18, 2001, by Martin Standing, entitled High Voltage Semiconductor Device Housing With Increased Clearance Between Housing Can and Die for Improved Flux Flushing, to which a claim of priority is hereby made.

FIELD OF THE INVENTION

This invention relates to semiconductor devices and more specifically relates to a semiconductor device of the flip chip variety that permits an increase in the voltage rating of the device.

BACKGROUND OF THE INVENTION

The drive to miniaturization has led to the development of chip-scale or nearly chip-scale semiconductor devices. One variety of such devices includes a can-shaped connector which receives a semiconductor die in its interior and connects to an electrode of the die by a layer of conductive material such as solder or conductive epoxy. The can-shaped connector includes a wall portion which skirts around the die. The wall is closely spaced from the peripheral edges of the die and its electrodes. When such a device is soldered to a board using fluxed solder pastes residual flux is deposited around the soldered joints. When fluxes other than those marketed as "no clean" products are used for this purpose it is necessary to wash these residuals from under the device to prevent the device from suffering from the formation of corrosion or electrical breakdown.

FIGS. 1A-1B and 2A-2B show examples of known semiconductor devices in which a MOSFET silicon die 10, having a drain electrode 9 on its top surface and source electrode 14 and gate electrode (not shown) on its bottom surface, is housed in a conductive metal can 11. Thus, drain electrode 9 is secured, as by soldering or by a conductive adhesive to the interior surface of can 11. The rim 12 of can 11 is spaced from the periphery of die 10. Optionally, an insulation ring 13 may be provided between rim 12 and can 11. The bottom surface of source electrode 14 may be coplanar or slightly sub-flush with respect to the bottom of flange 15 of rim 12. Solder flux residue must be washed out when the package is soldered down to conductive traces on board 17. A shallow gap 16 (See FIG. 2B) between the rim 12 of the can and the board limits the ability for the cleaning medium to freely flow under the device. Therefore, adequate washing under the device cannot be easily achieved. Also, the close spacing between source electrode 14 and the interior of rim 12 may hinder the washing of the flux residue and may reduce the voltage which can be applied to the package.

Therefore, a semiconductor device is desired which allows for the easier washing of the flux residue and higher voltage applications.

BRIEF DESCRIPTION OF THE INVENTION

In accordance with the invention, the gap between the periphery of the die and the body of the metal can is increased so that flux residue may be removed more easily.

A semiconductor device according to the present invention includes a metal can which receives in its interior a semiconductor die. The metal can includes a recess formed on its top surface which creates a frame around the semiconductor die. The recess increases the rigidity of the top portion of the can thereby reducing the stress exerted on the die and the die attach material. Due to this increase in the height of the rim of the can and the increased distance between the formed drain contacts, more effective cleaning under the device may be achieved. This in turn results in a device that can be run at higher voltages.

Other features and advantages of the present invention will become apparent from the following description of the invention which refers to the accompanying drawings.

DETAILED DESCRIPTION OF THE FIGURES

Figure 1A:
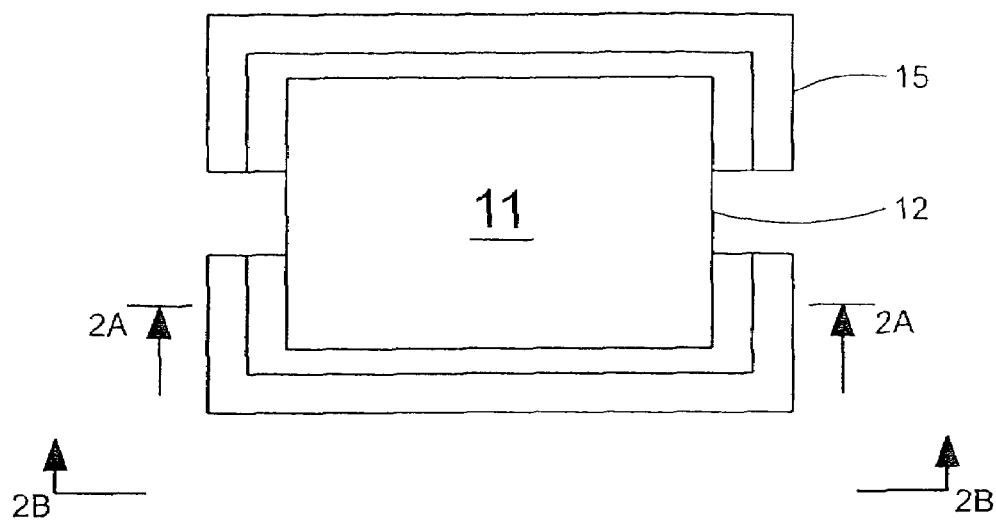
FIGS. 1A and 1B show top views of semiconductor devices according to the prior art.
Figure 1B:
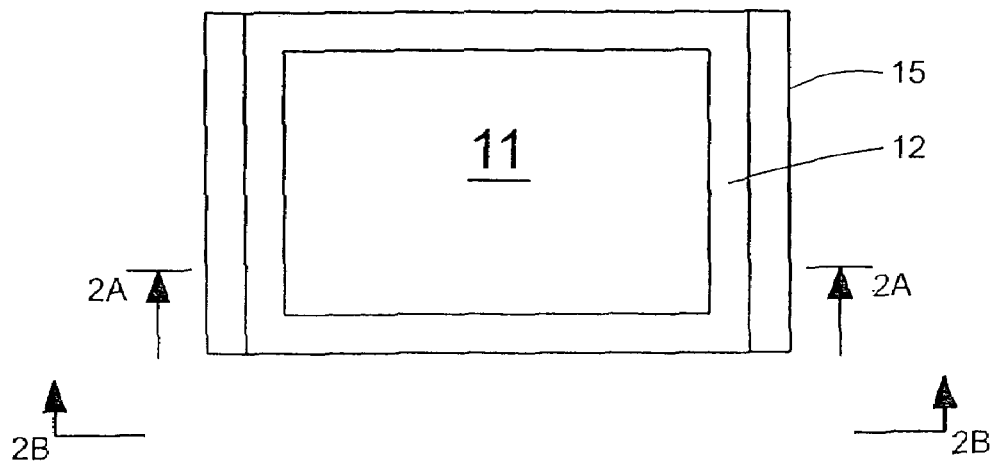
Figure 2A:
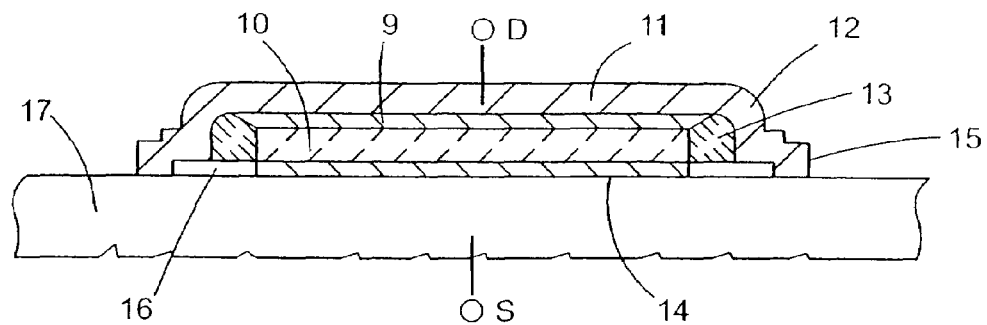
FIG. 2A is a cross-sectional view of the devices of FIGS. 1A and 1B along line 2A-2A viewed in the direction of the arrows.
Figure 2B:
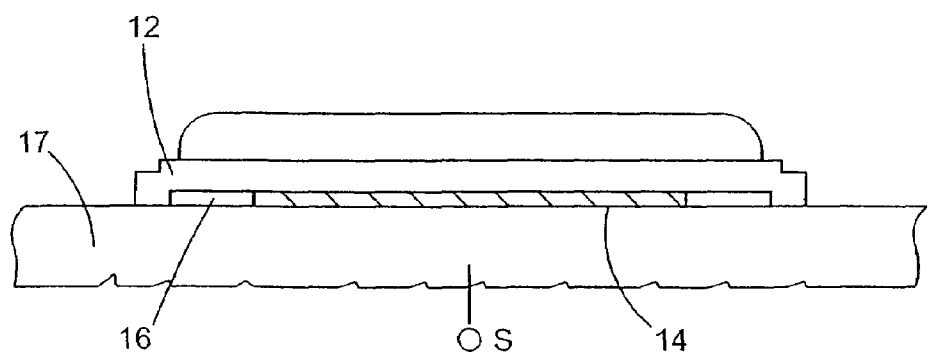
FIG. 2B is a cross-sectional view of the devices of FIGS. 1A and 1B along line 2B-2B viewed in the direction of the arrows.
Figure 3:
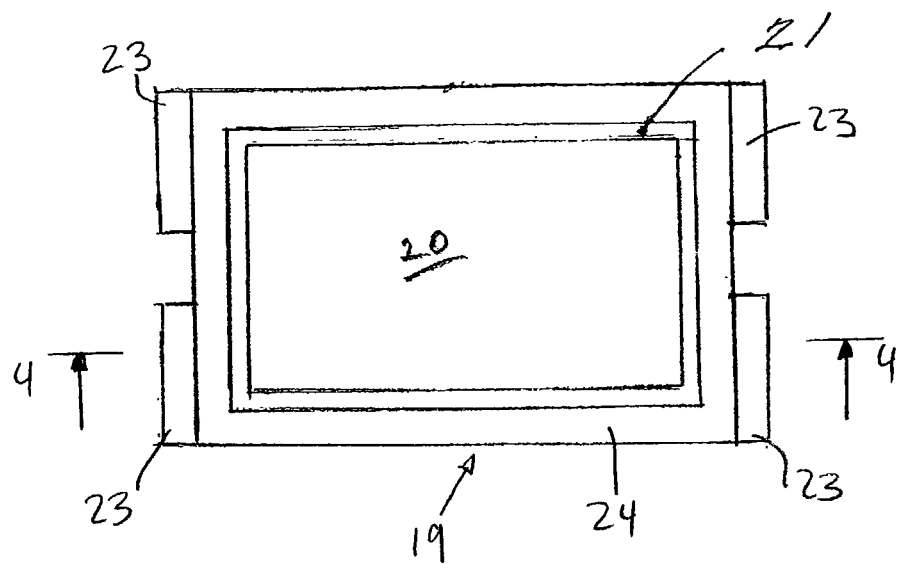
FIG. 3 is a semiconductor device according to the present invention.

Referring to FIG. 3, a semiconductor device according to the present invention includes metal can 19. Metal can 19 is preferably formed from copper and may be silver plated. Metal can 19 includes a web portion 20. Web portion 20 has formed therein recess 21. Recess 21 may be formed, for example, by stamping. Recess 21 can be replaced by a half shear of the top of metal can 19 around die 10.

Figure 4:
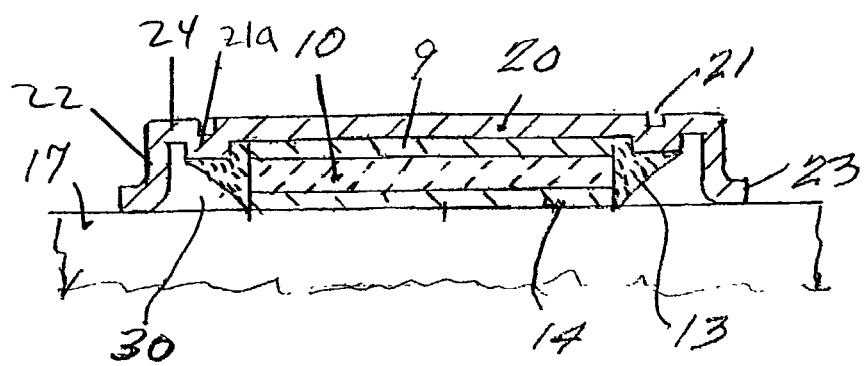
FIG. 4 is a cross-sectional view of the device shown in FIG. 3 along line 4-4 viewed in the direction of the arrows.

Now referring to FIG. 4, a semiconductor device according to the present invention includes metal can 19. Metal can 19 is comprised of a web portion 20, peripheral wall 22, and base portions 23. Drain 9 of die 10 is electrically connected by, for example, a layer of solder or conductive epoxy to web portion 20 of metal can 19. Recess 21 is formed in web portion 20 of metal can 19, which forms frame 21a around the peripheral edges of die 10. Optionally, an insulation ring 13 may be disposed between frame 21a and peripheral edges of die 10.

Peripheral wall 22 is spaced from die 10 and extends downwardly from edges of web portion 20 of metal can 19. Base portions 23 are spaced around the bottom edge of peripheral wall 22 and are coplanar with source 14 of die 10. Base portions 23 are electrically connectable to conductive portions (not shown) on board 17, thereby electrically connecting drain 9 to conductive portions (not shown) on board 17. In the preferred embodiment, base portions 23 extend away from the interior of metal can 19, and thus away from die 10. However, base portions 23 may be formed to extend in any direction. For example, base portions 23 may be oriented in a direction toward the interior of metal can 19, or even vertically directed toward board 17 to reduce the footprint of the device.

Web portion 20 also includes rim portion 24 which is disposed between recess 21 and peripheral wall 22. Rim portion 24 can be extended to increase space 30 between source electrode 14 and peripheral wall 22. The increase in distance between source electrode 14 and peripheral wall 22 improves creepage and thus allows the package to be used at higher voltages. Also, the increase in space 30 permits the improved flushing of flux residue produced while the package is soldered down to board 17. The increase in space by extending rim portion 24 can be realized because recess 21 (or half shear) creates a flange around die 10 which adds rigidity that could not otherwise be attained by simply increasing the size of web portion 20. As a result, the frame formed in web portion 20 has the rigidity of the previously known can while providing a much greater clearance around the edge of the device to permit more reliable cleaning of the flux residue.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor die having a first major electrode on a first major surface thereof, a second major electrode on a second major surface thereof opposing said first major surface and a control electrode disposed on said second major surface and electrically isolated from said second major electrode; and
   a metal can, said metal can including:
   a web portion electrically connected to said first major electrode, said web portion including a frame disposed around said die, a rim portion extending radially away from said frame portion, and
   a peripheral wall extending from said rim portion in a direction away from said first electrode, said peripheral wall bring spaced from said die.

2. The semiconductor device of claim 1, wherein said peripheral wall includes a plurality of base portions, said base portions being coplanar with said second major electrode.

3. The semiconductor device of claim 1, wherein said base portions extend away from said die.

4. The semiconductor device of claim 1, wherein said semiconductor die is a MOSFET.

5. The semiconductor device of claim 1, wherein said first major electrode is electrically connected to said web portion by a layer of conductive epoxy.

6. The semiconductor device of claim 1, wherein said first major electrode is electrically connected to said web portion by a layer of solder.

7. The semiconductor device of claim 1, wherein said metal can is made from copper.

8. The semiconductor device of claim 7, wherein said metal can is plated with silver.

9. The semiconductor device of claim 1, wherein said frame is a recess in said web portion of said metal can.

10. The semiconductor device of claim 1, further comprising an insulation ring extending between peripheral edges of said die and said frame.

\* \* \* \* \*